United States Patent
Luo et al.

(10) Patent No.: US 12,550,615 B2
(45) Date of Patent: Feb. 10, 2026

(54) SEMICONDUCTOR BRIDGE COUPLED WITH ONE OR MORE THERMISTORS AND THE METHOD OF THE SAME

(71) Applicant: Hangzhou Dianzi University, Zhejiang (CN)

(72) Inventors: Jianjun Luo, Campbell, CA (US); Chunyang Feng, Zhejiang (CN)

(73) Assignee: Hangzhou Dianzi University, Zhejiang (CN)

( * ) Notice: Subject to any disclaimer, the term of this patent is extended or adjusted under 35 U.S.C. 154(b) by 728 days.

(21) Appl. No.: 17/956,023

(22) Filed: Sep. 29, 2022

(65) Prior Publication Data
US 2024/0114792 A1    Apr. 4, 2024

(51) Int. Cl.
| | |
|---|---|
| H01L 31/0525 | (2014.01) |
| F42B 3/13 | (2006.01) |
| H02S 40/44 | (2014.01) |
| H10D 84/00 | (2025.01) |
| H10N 19/00 | (2023.01) |

(52) U.S. Cl.
CPC .............. *H10N 19/00* (2023.02); *F42B 3/13* (2013.01); *H10D 84/209* (2025.01)

(58) Field of Classification Search
CPC ........ H10N 19/00; F42B 3/13; H10D 84/209; H10D 1/47; H10D 86/85
See application file for complete search history.

(56) References Cited

U.S. PATENT DOCUMENTS

| | | | | |
|---|---|---|---|---|
| 4,708,060 | A | * 11/1987 | Bickes, Jr. | ................ F42B 3/13 102/202.7 |
| 5,294,839 | A | * 3/1994 | Jaeschke | ................ H02H 9/001 307/127 |
| H1366 | H | * 11/1994 | Bickes, Jr. | ................ 102/202.5 |
| 5,861,570 | A | * 1/1999 | Bickes, Jr. | ................ F42B 3/13 102/202.7 |

(Continued)

OTHER PUBLICATIONS

Wang et al., Ignition and safety characteristics of semiconductor bridge with NTC thermistor, Sep. 4, 2020 (Year: 2020).*

(Continued)

*Primary Examiner* — Ismail A Muse
(74) *Attorney, Agent, or Firm* — Joe Zheng

(57) ABSTRACT

A detonator for an explosive material is described. The detonator includes a semiconductor bridge, coupled with the explosive material, including thermal feedback mechanism is provided via one or more thermistors. An exemplary mechanism includes a semiconductor bridge with a polysilicon resistor and a pair of thermistors. The two thermistors are disposed to be substantially close to or sandwich the polysilicon resistor. When the temperature surrounding the polysilicon resistor is getting upwards, the temperature surrounding the thermistors is equally going up. When the temperature reaches a critical point, but below the threshold of the polysilicon resistor, the resistance of the thermistors drops suddenly or drastically, causing the current driving up the temperature of the polysilicon resistor to divert through the VOX temp resistors. Subsequently the current going through the polysilicon resistor is reduced, causing the temperature to drop downwards.

16 Claims, 7 Drawing Sheets

(56) References Cited

U.S. PATENT DOCUMENTS 10,458,858 B1 * 10/2019 Arft ........................ H03L 1/00
2021/0011090 A1 * 1/2021 Sato ...................... G01R 31/52

OTHER PUBLICATIONS

An Overview of Semiconductor Bridge, SCB, Applications at Sandia National Laboratories, 318 AIAA/ASME/SAE/ASEE Joint Propulsion Conference and Exhibit, Jul. 10-12, 1995/San Diego, CA.
Sandia Report, Characterization and Electrical Modeling of Semiconductor Bridges, Mar. 1997.

* cited by examiner

SEMICONDUCTOR BRIDGE COUPLED WITH ONE OR MORE THERMISTORS AND THE METHOD OF THE SAME

BACKGROUND OF THE INVENTION

Field of Invention

The invention generally is related to the area of firing units for initiating detonators, and more particularly related to a detonator including a semiconductor bridge (SCB) with embedded circuitry to deter unplanned triggering of the detonator.

Related Art

Detonators are small devices used for detonating an explosive. Besides the obvious military applications, various detonators may be used peacefully in civilian or commercial applications. One example of such applications is the airbags in modem vehicles built with pressure and crash sensors that help to detect when a collision has occurred. When the sensors detect a collision, they trigger one or more detonators to deploy the corresponding airbags (e.g., front, side or head curtain airbags) via the detonators. Generally, the detonators can be of two types: electrical and percussion. A percussion detonator responds to some type of mechanical force to activate an explosive. An electrical detonator responds to predefined electrical signal to activate an explosive.

Electro-explosive devices (EED) are commonly used in the electrical detonator. It is an electric resistance encapsulated by a primary explosive, essentially converting electrical energy into thermal energy to start an explosive chemical reaction. Most electro-explosive (e.g., bridge wire or metal foil) devices contain a small metal bridge wire heated by a current pulse from a firing set with nominal output voltages ranging from one to several tens of volts. In order to obtain environmental tolerance along with acceptable shelf-life, electro-explosive devices are usually designed with hermetically sealed housings with electrical feed-throughs. Additionally, thermally-initiated devices must be able to withstand reasonable, unintended currents without firing because relatively-low energies could cause firing of the devices over time.

R. W. Bickes, et al of Sandia Corporation teaches a semiconductor bridge or SCB, as shown in FIG. 1 in U.S. Pat. No. 5,861,570. The bridge 12 is shown to be deposed between two conductive (e.g., metallized) lands 14 and 16. Header wires 10 are connected (for example, bonded by ultrasonic bonds, thermocompressive bonds, or TAB bonds, edge metallization, etc.) to the lands 14 and 16 and the electrical feed-throughs on the header posts 5 of the explosive to permit a current pulse to flow from land-to-land through the SCB 12. Header wires 10 are connected to the lands 14 and 16 in a configuration that is substantially parallel to the direction of current flow through the SCB 12, i.e., substantially parallel to the length of the SCB 12. If the current conduction means depicted in FIG. 1 are not employed, then the SCB explosive devices will neither detonate nor initiate.

There are various hazards associated with the electrical detonators like accidental initiation due to electrostatic discharge or radio frequency interference, improper firing of the circuit or problem in delay or logic of the circuit. For example, a small current flows through the SCB 12 could generate some heat. The heat can accumulate and exceed a threshold over time, the SCB explosive device can eventually detonate, resulting in an undesired accident. Thus, there is a great need for reliable and safe initiator in order to prevent catastrophes.

SUMMARY OF THE INVENTION

This section is for the purpose of summarizing some aspects of the present invention and to briefly introduce some preferred embodiments. Simplifications or omissions in this section as well as in the abstract may be made to avoid obscuring the purpose of this section and the abstract. Such simplifications or omissions are not intended to limit the scope of the present invention.

The present invention generally pertains to method and apparatus for a detonator including a semiconductor bridge (SCB) with embedded circuitry to deter unplanned triggering of the detonator. According to one aspect of the present invention, a thermal feedback mechanism is provided via one or more thermistors. The mechanism includes an SCB provided with a polysilicon resistor and one or more thermistors, preferably a pair or more disposed next to polysilicon resistor to increase the sensitivity of thermal feedback. In one aspect, the thermistors are Vanadium Oxide temperature resistors (or VOX temp resistors). A VOX temp resistor maintains characteristics of sudden resistance drop when its ambient temperature reaches a threshold (e.g., 60 or 80 degrees). One or more VOX temp resistors are disposed substantially close to or sandwich the polysilicon resistor. When the temperature surrounding the polysilicon resistor is getting upwards, the temperature surrounding the VOX temp resistors is equally going up. When the temperature reaches a critical point, but below the threshold of the polysilicon resistor, the resistance of the VOX temp resistors drops suddenly and drastically, causing the current driving up the temperature of the polysilicon resistor to divert through the VOX temp resistors. Subsequently the current going through the polysilicon resistor is reduced, causing the temperature to drop downwards.

According to yet another aspect of the present invention, the polysilicon resistor and the thermistors are coupled in parallel and connected via one conductive pad on one side. The polysilicon resistor and the thermistors are further thermally coupled via the conductive pad or conductive pads and the substrate so that the thermistors can readily sense any heat that may be generated on or near the polysilicon resistor.

The present invention may be implemented as an apparatus, a method, and a part of system. Different implementations may yield different benefits, objects and advantages. According to one embodiment, the present invention is a detonator for an explosive material. The detonator comprises: a semiconductor bridge, coupled with the explosive material, including a polysilicon resistor, wherein the polysilicon resistor is coupled with or in contact to the explosive material, a current flow throughout the polysilicon resistor generates heat, the heat is accumulated over time and ignite the explosive material when the heat exceeds a threshold for the polysilicon resistor. The semiconductor bridge further comprises one or more thermistors disposed in parallel next to the polysilicon resistor and sensing the heat, resistance of the thermistors drops drastically when the heat exceeds a threshold for the thermistors, wherein the current flow is diverted from the polysilicon resistor to the thermistors so as to reduce the heat being generated in the polysilicon resistor, the threshold for the thermistors is lower than the threshold for the polysilicon resistor.

According to one embodiment, the present invention is a method of a detonator for an explosive material, the method comprises: providing a semiconductor bridge to couple with the explosive material, the semiconductor bridge including: a polysilicon resistor and one or more thermistors disposed in parallel next to the polysilicon resistor; and coupling the polysilicon resistor with the explosive material, wherein a current flow throughout the polysilicon resistor generates heat, the heat is accumulated over time and ignite the explosive material when the heat exceeds a threshold for the polysilicon resistor. The method further comprises dropping resistance of the thermistors drastically when the heat exceeds a threshold for the thermistors, wherein the current flow is diverted from the polysilicon resistor to the thermistors so as to reduce the heat being generated in the polysilicon resistor, the threshold for the thermistors is lower than the threshold for the polysilicon resistor.

There are many other objects, together with the foregoing attained in the exercise of the invention in the following description and resulting in the embodiment illustrated in the accompanying drawings.

BRIEF DESCRIPTION OF THE FIGURES

These and other features, aspects, and advantages of the present invention will be better understood with regard to the following description, appended claims, and accompanying drawings where:

DETAILED DESCRIPTION OF THE INVENTION

The detailed description of the invention is presented largely in terms of procedures, steps, logic blocks, processing, and other symbolic representations that directly or indirectly resemble the operations of communication or storage devices that may or may not be coupled to networks. These process descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Figure 1:
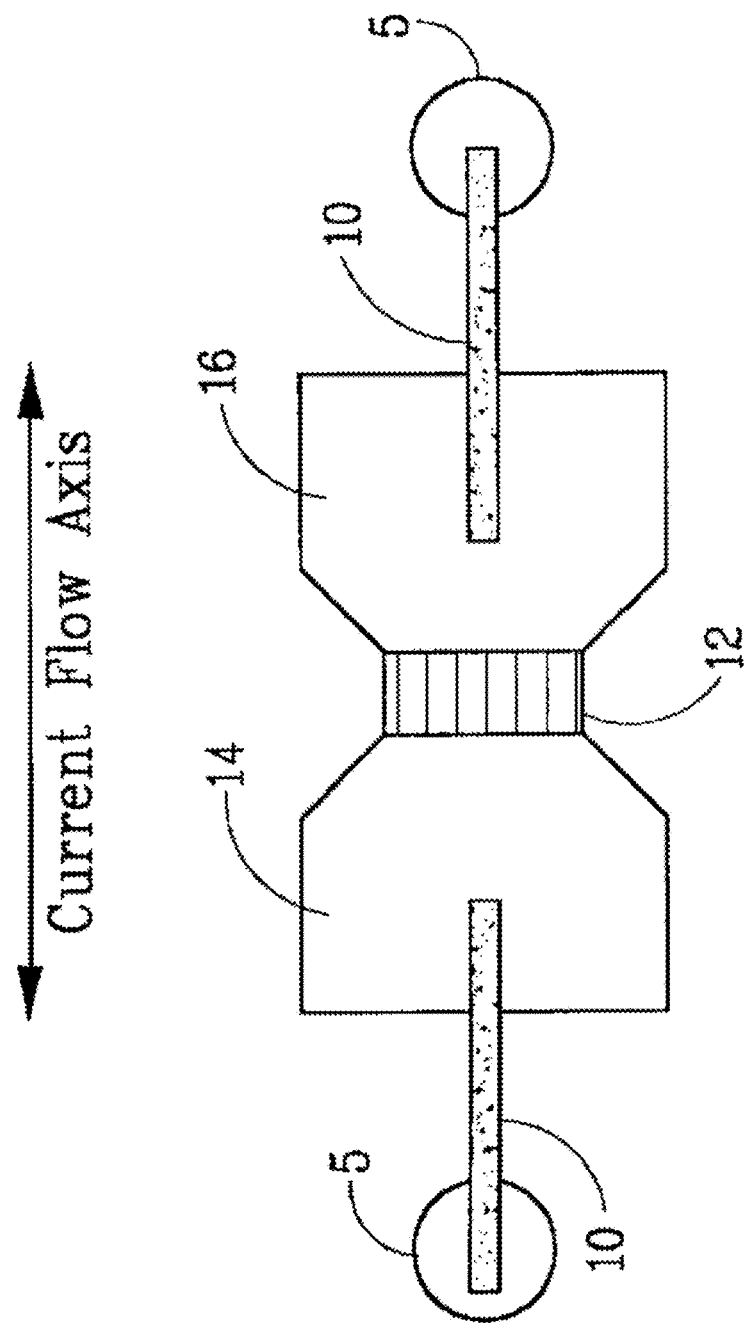
FIG. 1 duplicates FIG. 1 of U.S. Pat. No. 5,861,570.
Figure 2:
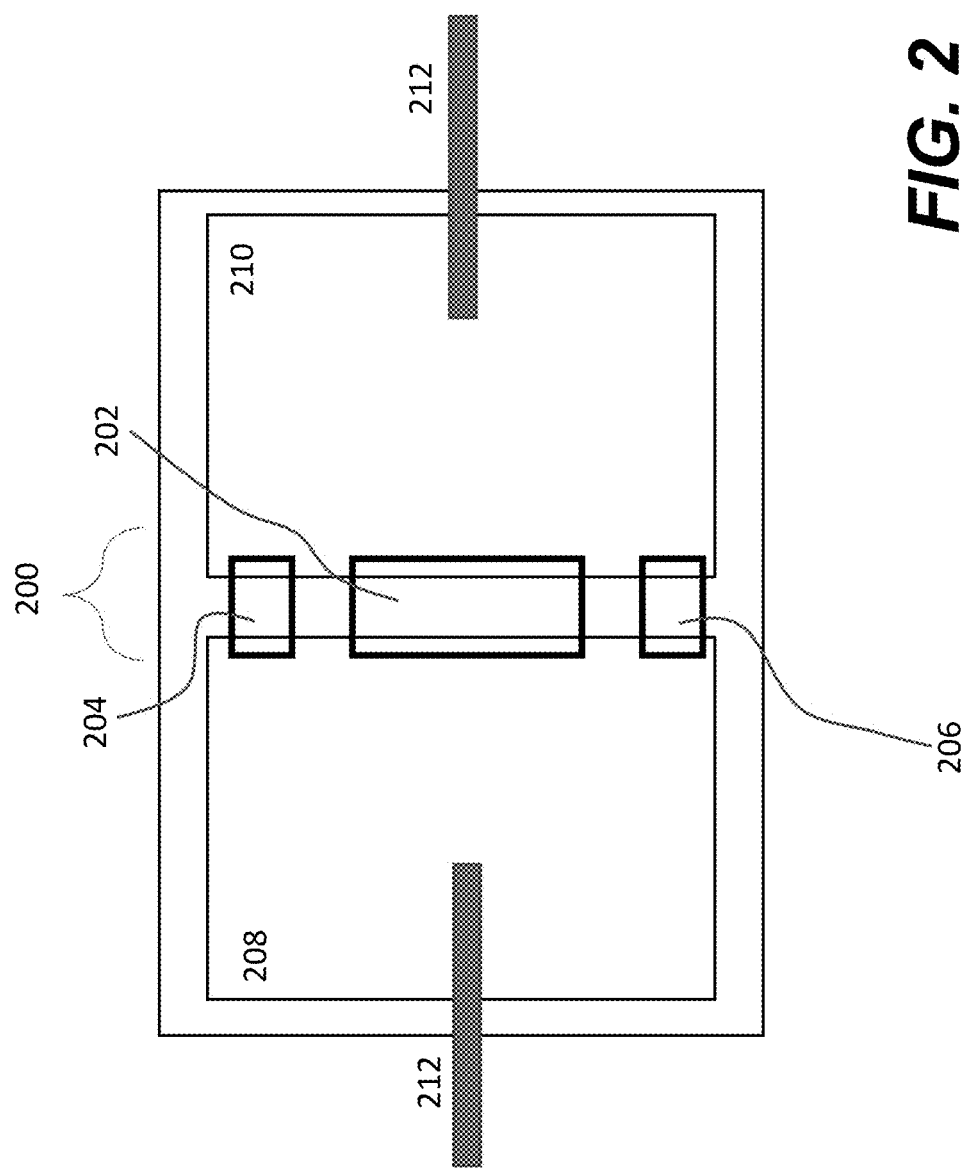
FIG. 2 shows an exemplary semiconductor bridge according to one embodiment of the present invention.

Referring now FIG. 2, it shows an exemplary semiconductor bridge 200 according to one embodiment of the present invention. The bridge 200 includes a polysilicon resistor (R) 202 and one or more Vanadium Oxide temperature resistors (VO thermistors or RT) 204 and 206. To facilitate the description of various embodiments, a pair of thermistors are used or illustrated herein. The bridge 200 is disposed between conductive (e.g., metallized) lands or pads 208 and 210. Wires (not shown) are connected to the pads 204 and 206. A current or current pulse, when available, flows from one pad to another pad through the SCB 200. According to one embodiment, a pair of wires 212 are connected to the pads 208 and 210 and in a configuration that the wires 212 are substantially parallel to the direction of current flow through the SCB 200. In reference to U.S. Pat. No. 5,861,570, it is an important and significant feature of the present invention that the wires 212 be connected substantially in parallel to the direction of the current flow axis through the SCB 200 as shown in FIG. 2. It would appear that the orientation of the wires 212 would have no bearing on the current provided to the SCB 200 along its current flow axis. However, in one embodiment, if the current conduction means depicted in FIG. 2 and described herein are not employed, then the SCB explosive devices will neither detonate nor initiate, which is an unexpected result. In other embodiments, the orientation of the wires 212 is slightly off the parallel direction of the current flow axis through the SCB 200 as shown in FIG. 2.

In one embodiment, the polysilicon resistor 202 is a small, doped polysilicon or silicon layer formed on a non-conducting substrate (e.g., silicon or sapphire). The heavily doped, approximately one ohm, polysilicon resistor 202 is formed between two spaced conductive pads 208 and 210 (e.g., metal such as aluminum) and in contact with an explosive material. The length of the polysilicon resistor 202 is determined by the spacing of the conductive pads 208 and 210. In one example, the polysilicon resistor 202 is made 100 μm long and 380 μm wide and the doped layer is typically 2 μm thick. The conductive pads 208 and 210 provide a low ohmic contact to the underlying doped layer. The resistance of the polysilicon resistor 202 at ambient conditions is typically one ohm.

One example of a vanadium oxide temperature resistor (VOX thermistor or RT) is vanadium dioxide-based (VO2) thermistors that are temperature-dependent resistors, changing resistance with changes in temperature. They are very sensitive and react to very small changes in temperature. According to one embodiment, a pair of thermistors or VO2 thermistors are used as resistors 204 and 206. One of the characteristics for the VO2 thermistors is shown in the substantial change in resistance when the ambient temperature reaches a threshold.

Figure 3:
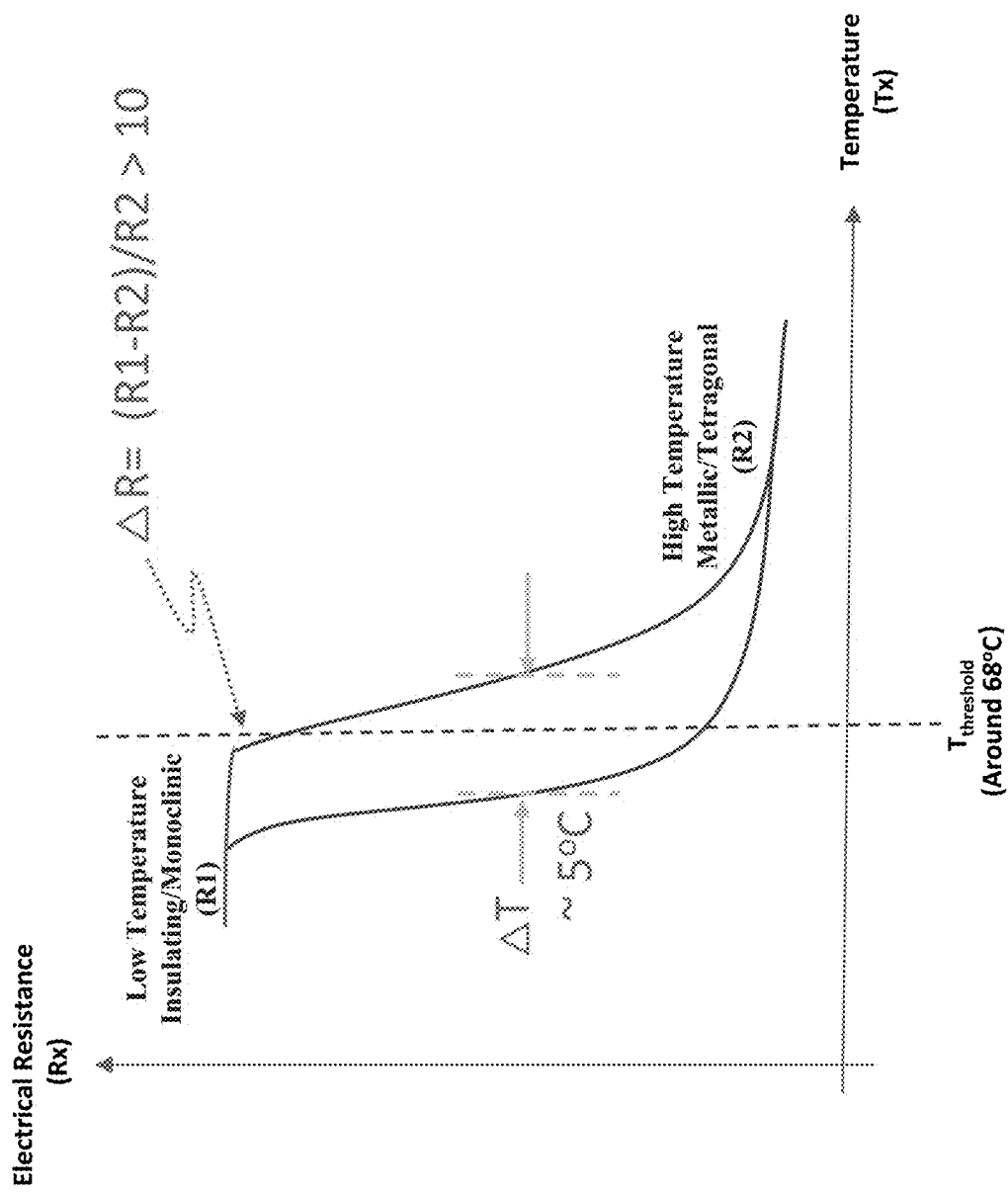
FIG. 3 shows a diagram in which the magnitude of the change in resistance is greater than three orders of magnitude.
Figure 4:
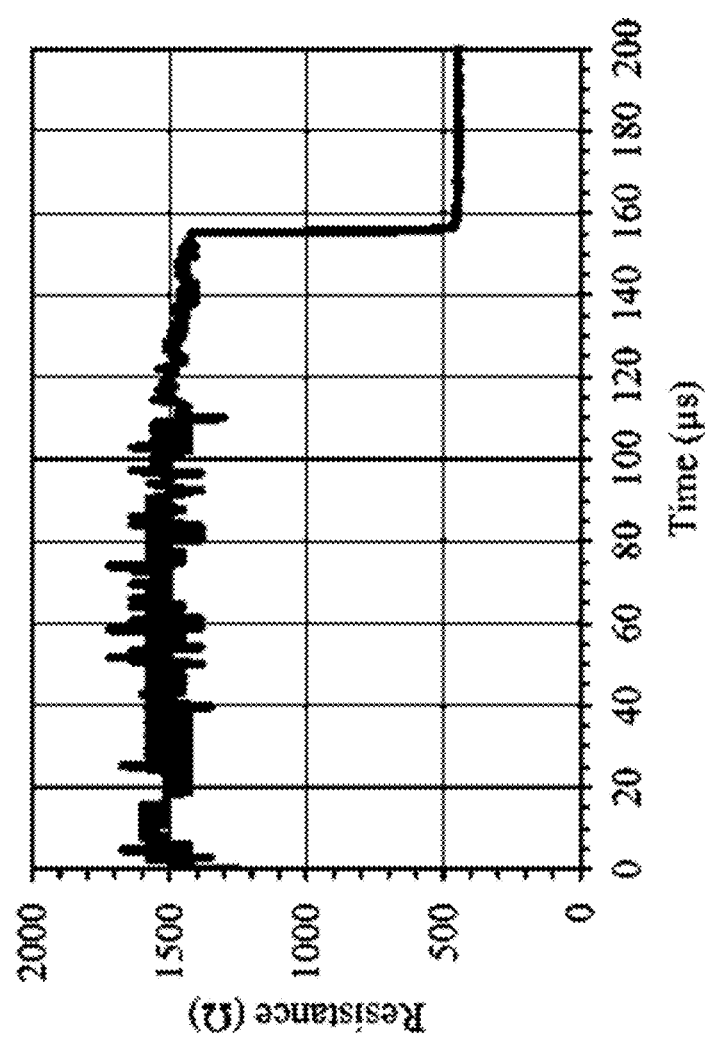
FIG. 4 shows a schematic diagram of the transient characteristics of a resistor.

In one embodiment, the threshold Tc=68° C. Depending on the physical properties of VO2, vanadium dioxide (VO2) has unique phase transition characteristics that convert between insulators and metals, behaving as insulators at room temperature and metal conductors above 68° C. (Tc). The magnitude of the change in resistance is greater than three orders of magnitude as shown in FIG. 3. A schematic diagram of the transient characteristics of a resistor is shown in FIG. 4.

Figure 5:
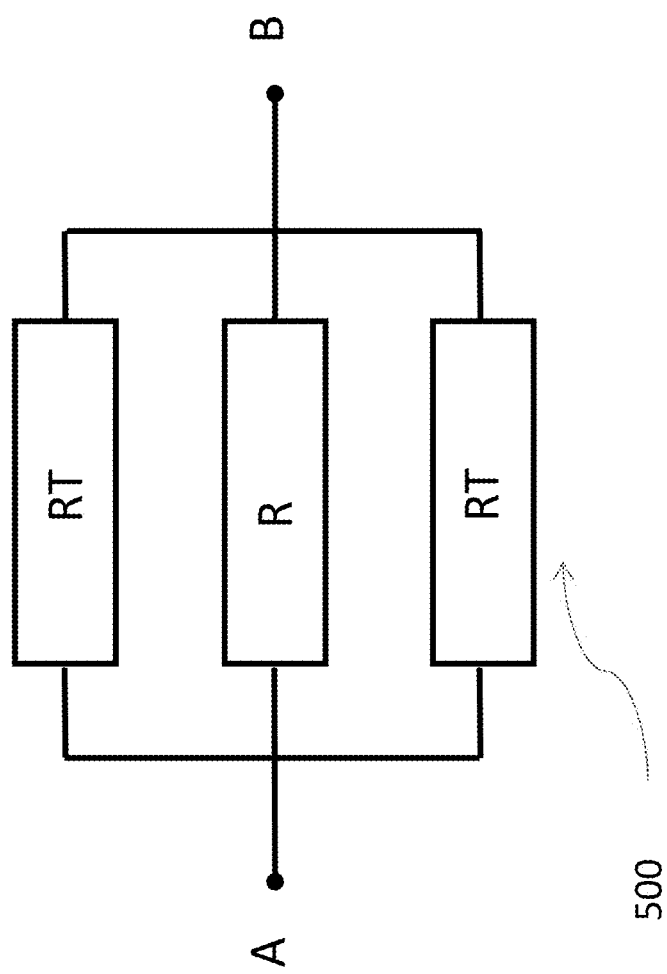
FIG. 5 shows an equivalent circuit of an exemplary thermal feedback mechanism according to FIG. 2.

FIG. 5 shows an equivalent circuit 500 of the thermal feedback mechanism. The circuit 500 is a two-terminal device with no polarity and two ports A and B. The SCB includes three resistors connected in parallel, a polysilicon resistor R and two thermistors RT. In one embodiment, these three resistors are implemented via well-known microelectronic technology and integrated in one or more chips.

Figure 6:
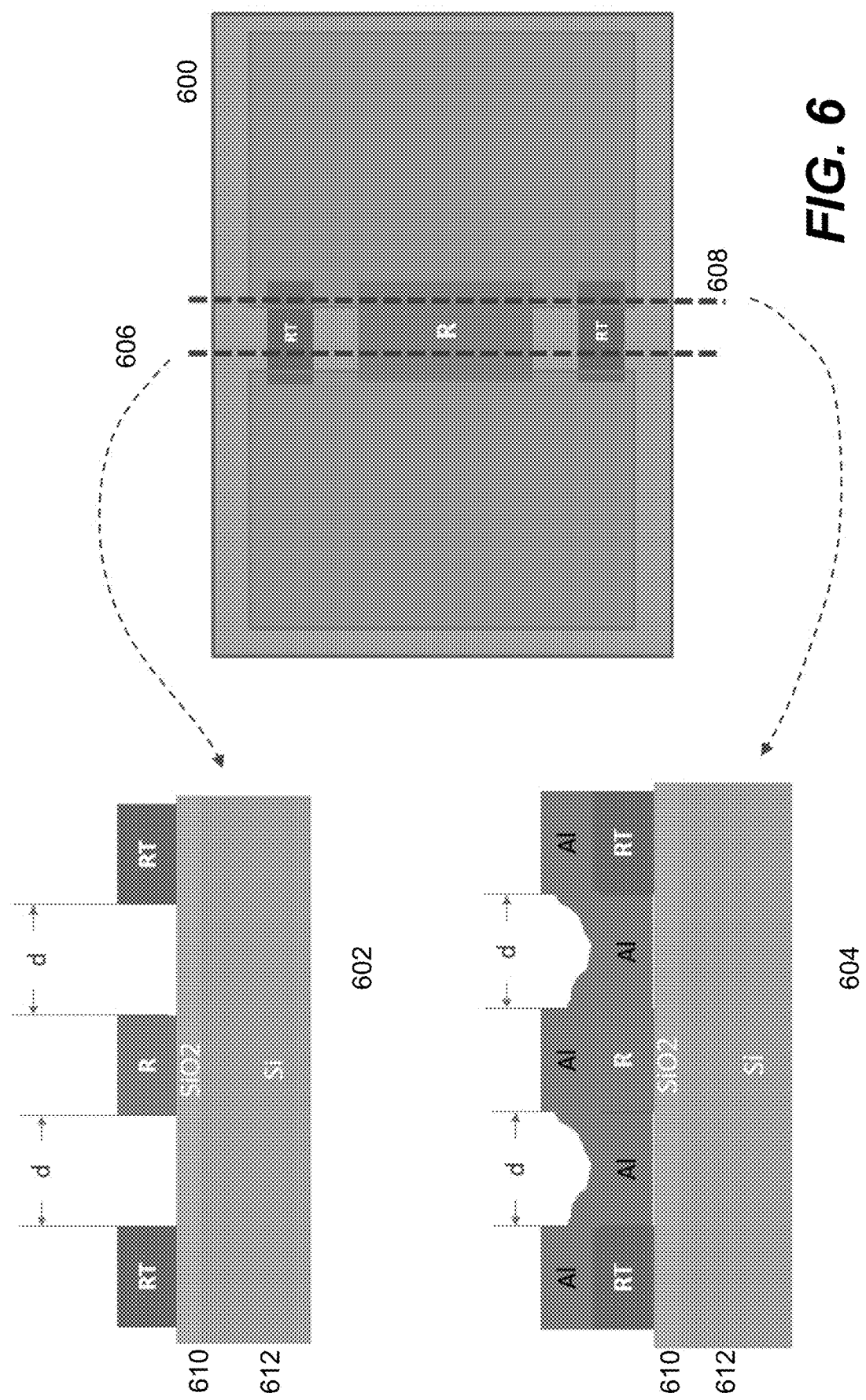
FIG. 6 shows an exemplary semiconductor bridge with two cross-section views along two corresponding cut lines.

FIG. 6 shows an exemplary semiconductor bridge 600 with two cross-section views 602 and 604 along two corresponding cut lines 606 and 608. An insulating layer 610 is provided on top of a substrate layer 612. Examples of the insulating layer 610 may be an insulating medium such as SiO2 (Silicon dioxide or Si3N4 (Silicon Nitride). The polysilicon resistor R and the two thermistors RT are arranged on top of the insulating layer 610 and isolated from each other. The substrate layer 612 may be made of materials such as silicon, sapphire or glass. If the substrate layer 612 is made of silicon, the substrate layer 612 can also be used to make other electronic devices, such as protection circuits, switching devices, SOC integrated circuits.

It is assumed that there is a small current going through the polysilicon resistor R for whatever the reason may be. The small current is not intended to trigger the polysilicon resistor R but can cause some heat that may be accumulated over a time if the heat is not dissipating fast enough. The temperature is at the same time being sensed by the thermistors RT. When the temperature exceeds the threshold for the thermistors RT, where the temperature threshold for the thermistors RT is considerably lower than the temperature threshold for the polysilicon resistor R, the resistance of the thermistors RT drops quickly, the shunts formed by the thermistors RT are created and the heat is absorbed. As a result, the heat on the polysilicon resistor R or other electrothermal product will not be accumulated, therefore not causing the polysilicon resistor R to react, hence avoiding accidents of accidental ignition. Under normal ignition conditions, the resistance of the thermistor RT is much greater than that of the polysilicon resistor R, which has no impact on the ignition of the polysilicon resistor R.

According to one embodiment, one or more thermistors (preferably two or more) are symmetrically disposed around the polysilicon resistor R so that multiple symmetrical shunts are deployed to quickly and uniformly cool down the transducers. Preferably, the typical resistance of polysilicon resistor R is around 1 ohm. It may be formed by re-doped or heavily doped N-type polysilicon, or a metal film bridge prepared by a single metal or composite metal. In one embodiment, a polysilicon resistor R is made of microelectronics heavily doped polysilicon materials, typical resistivity $7.6\times10^{-4}$ Ωcm, typical size 100 um(L)×380 um(W)×2 um(H). It can also be a metal membrane bridge formed by a simple metal or composite metal deposited by microelectronic PVD process, wherein the elemental metal is Ti/Al/Ni/Cr/Pt/Au. The composite metal is either NiCr/PtW/NiAl, and the typical resistivity $1.0\times10^{-4}$ Ωcm.

Figure 7:
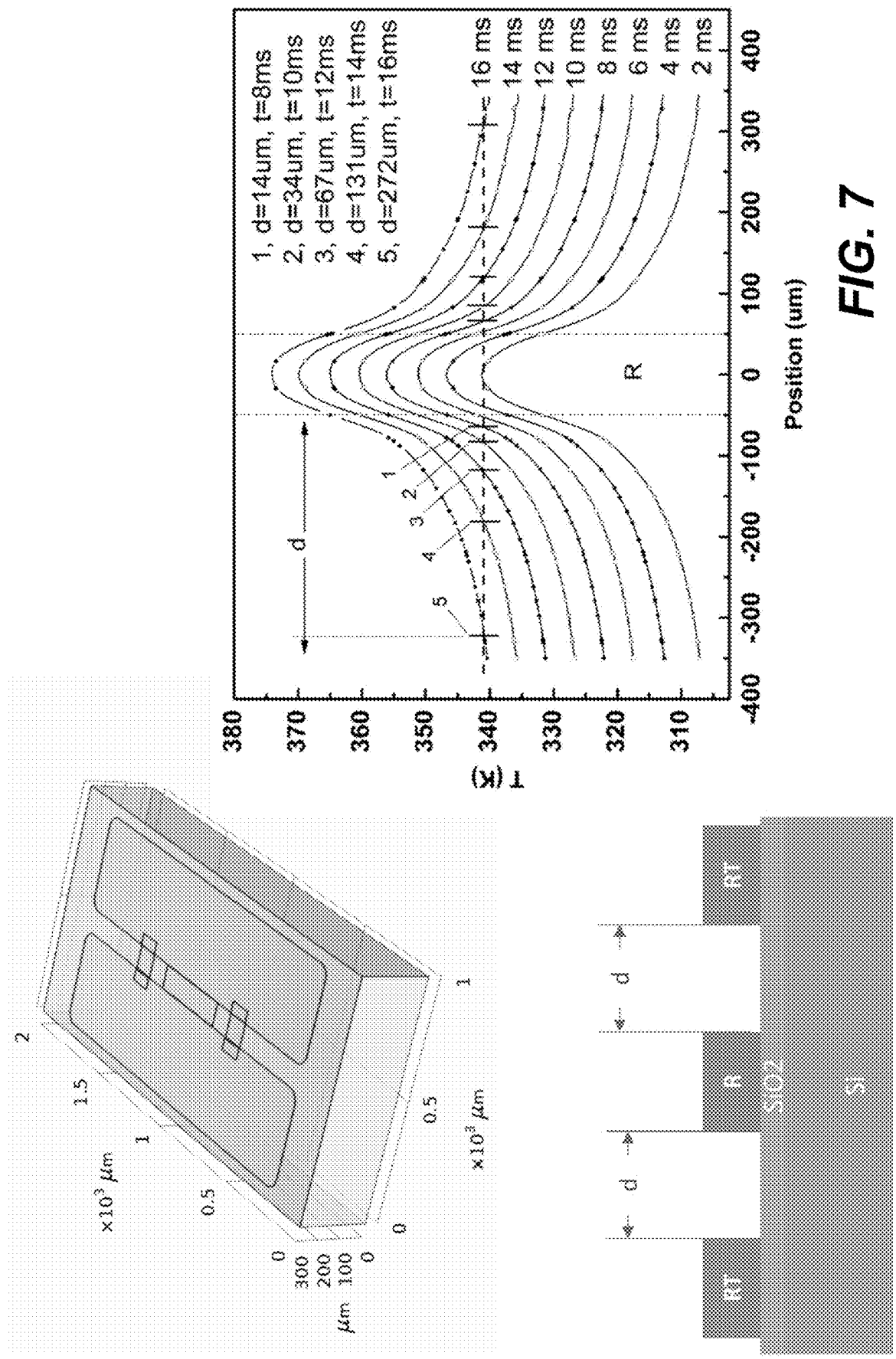
FIG. 7 shows exemplary characteristics or relationships among Schematic a thermal relaxation time, and a distance between a polysilicon resistor (R) and a thermistor in one embodiment.

The spatial distance d between the polysilicon resistor R and each of the two thermistors RT may be selected to determine the degree of thermal coupling between the polysilicon resistor R and the two thermistors RT. Subject to the material used for the pads (e.g., Al material), the thermal coupling between a polysilicon resistor R and a thermistor can be adjusted by adjusting the distance therebetween. FIG. 7 shows exemplary characteristics or relationships among a thermal relaxation time, and a distance between a polysilicon resistor (R) and a thermistor in one embodiment.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claim. Accordingly, the scope of the present invention is defined by the appended claims rather than the forgoing description of embodiments.

We claim:

1. A detonator for an explosive material, comprising:
a semiconductor bridge, coupled with the explosive material, including:
a polysilicon resistor, wherein the polysilicon resistor is coupled with or in contact to the explosive material, a current flow throughout the polysilicon resistor generates heat, the heat is accumulated over time and ignite the explosive material when the heat exceeds a threshold for the polysilicon resistor;
one or more thermistors disposed in parallel next to the polysilicon resistor and sensing the heat, resistance of the thermistors drops drastically when the heat exceeds a threshold for the thermistors, wherein the current flow is diverted from the polysilicon resistor to the thermistors so as to reduce the heat being generated in the polysilicon resistor, the threshold for the thermistors is lower than the threshold for the polysilicon resistor; and
an insulate layer, where the polysilicon resistor and the at least two thermistors are precisely arranged in parallel across two spaced conductive pads and on top of the insulating layer and isolated from each other.

2. The detonator as recited in claim 1, further comprising:
a non-conducting substrate, where the insulate layer is arranged or formed on top of the non-conducting substrate.

3. The detonator as recited in claim 2, wherein the polysilicon resistor is a doped polysilicon or silicon layer formed on the non-conducting substrate.

4. The detonator as recited in claim 3, wherein the polysilicon resistor is formed between two spaced conductive pads.

5. The detonator as recited in claim 1, wherein the polysilicon resistor, the thermistors and the two spaced conductive pads form a parallel resistor circuit.

6. The detonator as recited in claim 1, wherein the two spaced conductive pads are made to spread over terminals of the polysilicon resistor and the thermistors.

7. The detonator as recited in claim 6, wherein some or all of the two spaced conductive pads and the substrate provide heat coupling between the polysilicon resistor and the thermistors.

8. The detonator as recited in claim 1, wherein the one or more thermistors are at least
one pair, disposed evenly around the polysilicon resistor.

9. A method of a detonator for an explosive material, comprising:
providing a semiconductor bridge to couple with the explosive material, the semiconductor bridge including: a polysilicon resistor and one or more thermistors disposed in parallel next to the polysilicon resistor;
coupling the polysilicon resistor with the explosive material, wherein a current flow throughout the polysilicon resistor generates heat, the heat is accumulated over time and ignite the explosive material when the heat exceeds a threshold for the polysilicon resistor, the polysilicon resistor and the at least two thermistors are precisely arranged in parallel across two spaced conductive pads and on top of an insulating layer and isolated from each other and wherein the polysilicon resistor, the at least two thermistors and the two spaced conductive pads form a parallel resistor circuit; and dropping resistance of each of the thermistors drastically when the heat exceeds a threshold for the thermistors, wherein the current flow is diverted from the polysilicon resistor to the thermistors so as to reduce the heat being generated in the polysilicon resistor, the threshold for the thermistors is lower than the threshold for the polysilicon resistor.

10. The method as recited in claim 9, further comprising:
providing a non-conducting substrate, wherein the insulate layer is arranged or formed on top of the non-conducting substrate.

11. The method as recited in claim 10, wherein the polysilicon resistor is a doped polysilicon or silicon layer formed on the non-conducting substrate.

12. The method as recited in claim 11, wherein the polysilicon resistor is formed between two spaced conductive pads.

13. The detonate as recited in claim 12, wherein the polysilicon resistor, the thermistors and the two spaced conductive pads form a parallel resistor circuit.

14. The method as recited in claim 12, wherein the two spaced conductive pads are made to spread over terminals of the polysilicon resistor and the thermistors.

15. The method as recited in claim 14, wherein some or all of the two spaced conductive pads and the substrate provide heat coupling between the polysilicon resistor and the thermistors.

16. The method as recited in claim 9, wherein the one or more thermistors are at least one pair, disposed evenly around the polysilicon resistor.

* * * * *